US008598633B2

(12) United States Patent
Tarabbia et al.

(10) Patent No.: US 8,598,633 B2
(45) Date of Patent: Dec. 3, 2013

(54) SEMICONDUCTOR DEVICE HAVING CONTACT LAYER PROVIDING ELECTRICAL CONNECTIONS

(75) Inventors: Marc Tarabbia, Pleasant Valley, NY (US); James B. Gullette, Dresden (DE); Mahbub Rashed, Santa Clara, CA (US); David S. Doman, Austin, TX (US); Irene Y. Lin, Los Altos Hills, CA (US); Ingolf Lorenz, Ottendorf-Okrilla (DE); Larry Ho, Cupertino, CA (US); Chinh Nguyen, Austin, TX (US); Jeff Kim, San Jose, CA (US); Jongwook Kye, Pleasanton, CA (US); Yuansheng Ma, Santa Clara, CA (US); Yunfei Deng, Sunnyvale, CA (US); Rod Augur, Hopewell Junction, NY (US); Seung-Hyun Rhee, Fishkill, NY (US); Jason E. Stephens, Beacon, NY (US); Scott Johnson, Wappingers Falls, NY (US); Subramani Kengeri, San Jose, CA (US); Suresh Venkatesan, Danbury, CT (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/351,101

(22) Filed: Jan. 16, 2012

(65) Prior Publication Data

US 2013/0181289 A1 Jul. 18, 2013

(51) Int. Cl.
*H01L 23/52* (2006.01)
(52) U.S. Cl.
USPC .......................................... 257/207; 257/211

(58) Field of Classification Search
USPC .......................................... 257/207, 211, 210
See application file for complete search history.

(56) References Cited

U.S. PATENT DOCUMENTS

| 7,763,534 | B2 * | 7/2010 | Smayling et al. | 438/599 |
| 7,994,545 | B2 * | 8/2011 | Smayling et al. | 257/211 |
| 2009/0108360 | A1 * | 4/2009 | Smayling et al. | 257/368 |
| 2010/0252896 | A1 * | 10/2010 | Smayling et al. | 257/401 |
| 2011/0235407 | A1 * | 9/2011 | Lim et al. | 365/156 |
| 2011/0278681 | A1 | 11/2011 | Smayling et al. | |

FOREIGN PATENT DOCUMENTS

JP 2005183681 A1 7/2005

OTHER PUBLICATIONS

English translation of German Office Action prepared by German Patent office on Nov. 30, 2012 for DE 10 2012 215 529.5.

* cited by examiner

*Primary Examiner* — Ngan Ngo
(74) *Attorney, Agent, or Firm* — Ingrassia Fisher & Lorenz, P.C.

(57) ABSTRACT

A semiconductor device includes a semiconductor substrate having a diffusion region. A transistor is formed within the diffusion region. A power rail is disposed outside the diffusion region. A contact layer is disposed above the substrate and below the power rail. A via is disposed between the contact layer and the power rail to electrically connect the contact layer to the power rail. The contact layer includes a first length disposed outside the diffusion region and a second length extending from the first length into the diffusion region and electrically connected to the transistor.

19 Claims, 5 Drawing Sheets

SEMICONDUCTOR DEVICE HAVING CONTACT LAYER PROVIDING ELECTRICAL CONNECTIONS

FIELD OF THE INVENTION

The present invention generally relates to a semiconductor device, and more particularly relates to power connections to transistors in semiconductor devices

BACKGROUND OF THE INVENTION

As the size of semiconductor devices continues to decrease, the ability to create standard cell library logic devices, such as scan-D flip-flops and multiplexers, becomes more difficult. This is particularly the case at the 20 nm node, where lithographic limitation results in a lack of scaling of standard cell library devices.

Referring to FIG. 1, typical semiconductor devices 100 include a plurality of transistors 102 formed within a diffusion region 104. The semiconductor devices 100 utilize power rails 106, as part of a first metal layer 107, to deliver a reference voltage and/or ground to the transistors 102. Specifically, the power rail 106 includes power tabs 108 that extend into the diffusion region 104. A via 110 then electrically connects the power tab 108 to a source (not shown) or a drain (not shown) of one of the transistors 102.

The projection of the power tabs 108 into the diffusion region 104 causes difficulties, as the metal layer 107 is also routinely utilized for local interconnection between the transistors 102 and as cell pins 112. This leads to a very complicated patterning for the first metal layer 107, as is shown in FIG. 2, which routinely leads to fabrication difficulties and/or compromises in standard cell design. One solution is to use a second metal layer (not shown) on a different plane from the first metal layer 107. However, the use of the second metal layer reduces routing efficiency and results in a larger and more expensive implementation of the semiconductor device 100.

Accordingly, it is desirable to provide a semiconductor device arrangement with less resource conflict in the metal layer. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A semiconductor device includes a semiconductor substrate having a diffusion region. A transistor is formed within the diffusion region. The transistor includes a source, a drain, and a gate. A power rail is disposed outside the diffusion region. The device further includes a contact layer disposed above the substrate and below the power rail. A via is disposed between the contact layer and the power rail to electrically connect the contact layer to the power rail. The contact layer includes a first length disposed outside the diffusion region and a second length extending from the first length into the diffusion region and electrically connected to the transistor.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Referring to the figures, wherein like numerals indicate like parts throughout the several views, a semiconductor device 10 is shown and described herein. The semiconductor device 10 may be part of an integrated circuit (not separately numbered) as is well recognized by those skilled in the art.

Figure 1:
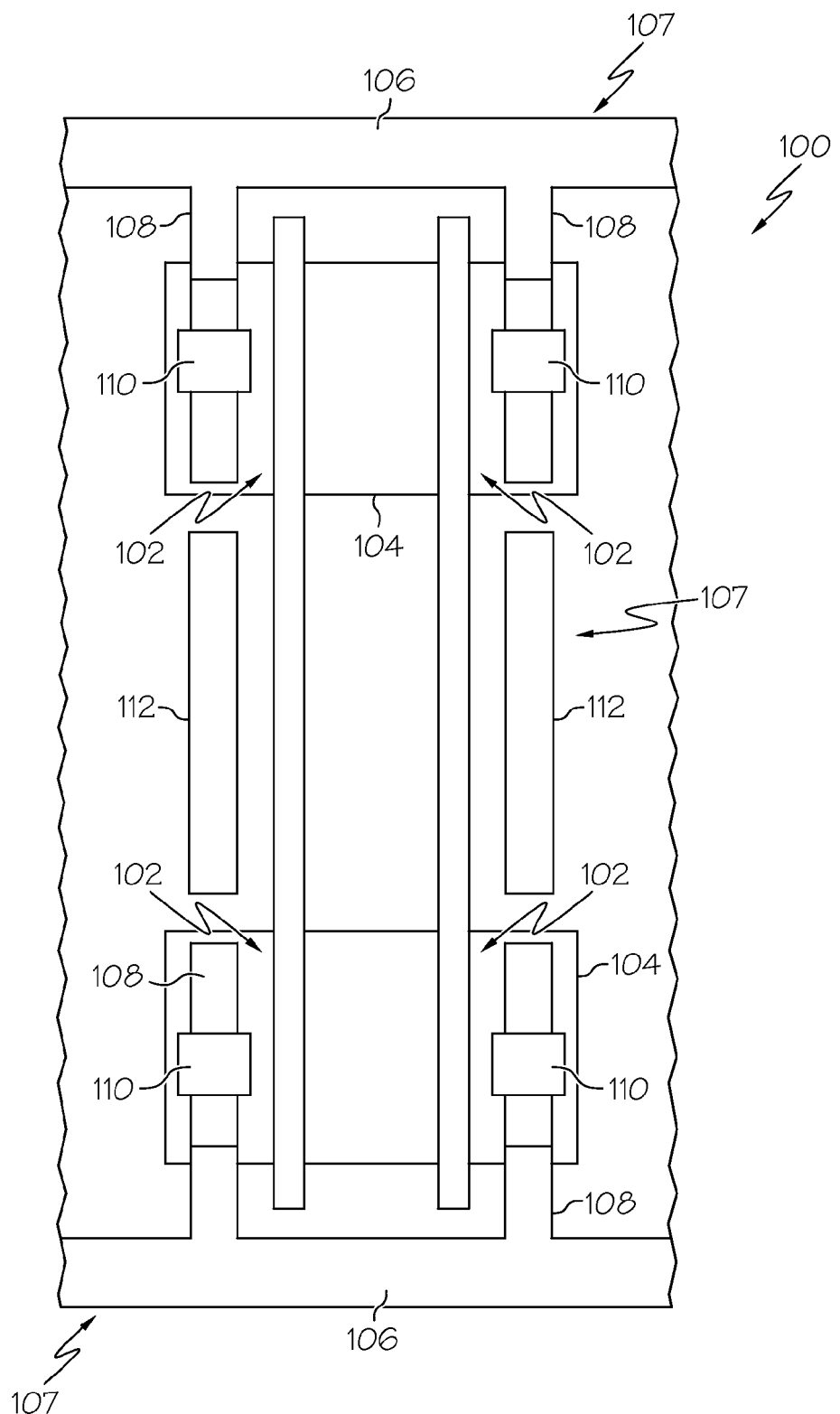
FIG. 1 is a top view of a portion of a semiconductor device according to the prior art showing power tabs extending from power rails into a diffusion region.
Figure 2:
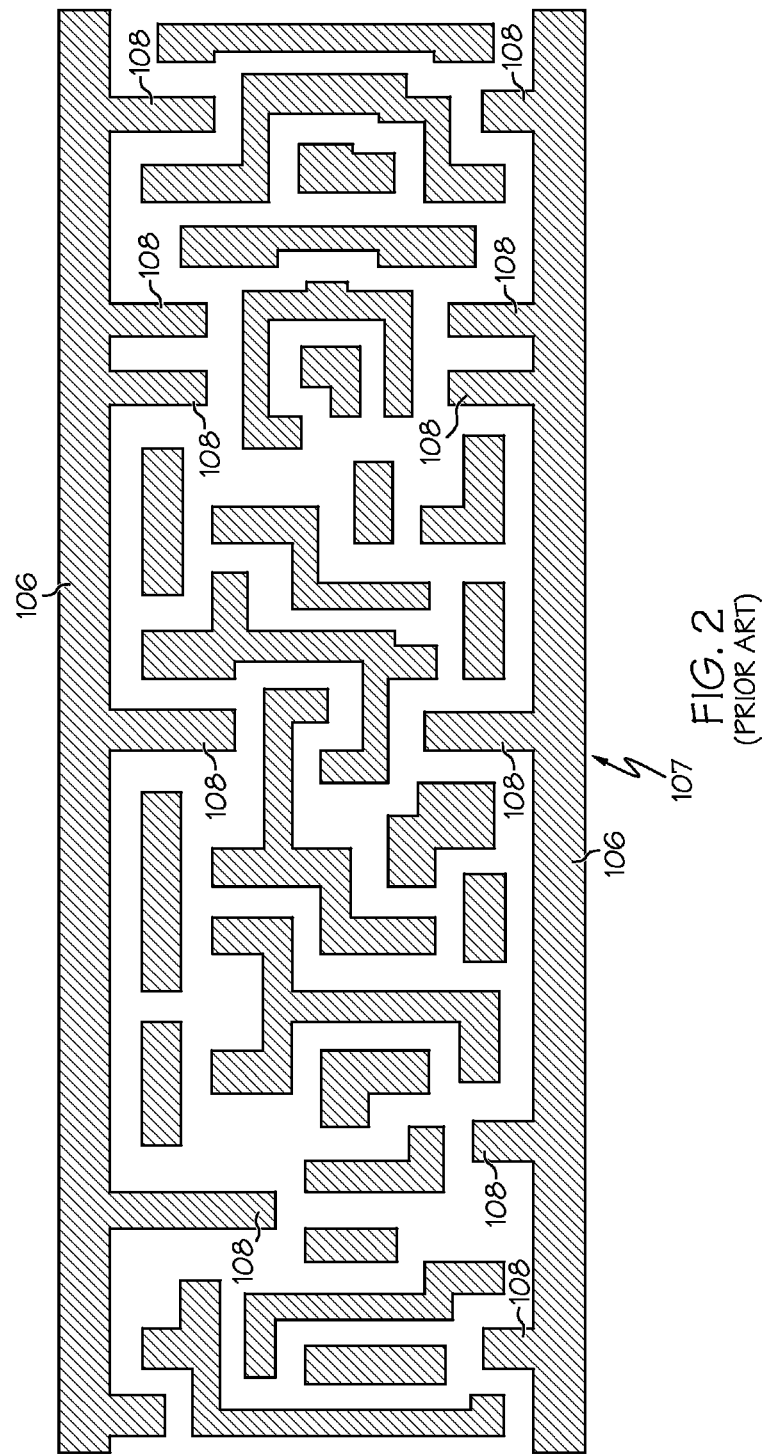
FIG. 2 is a top view of a metal layer of a semiconductor device according to the prior art including the power tabs and power rails.
Figure 3:
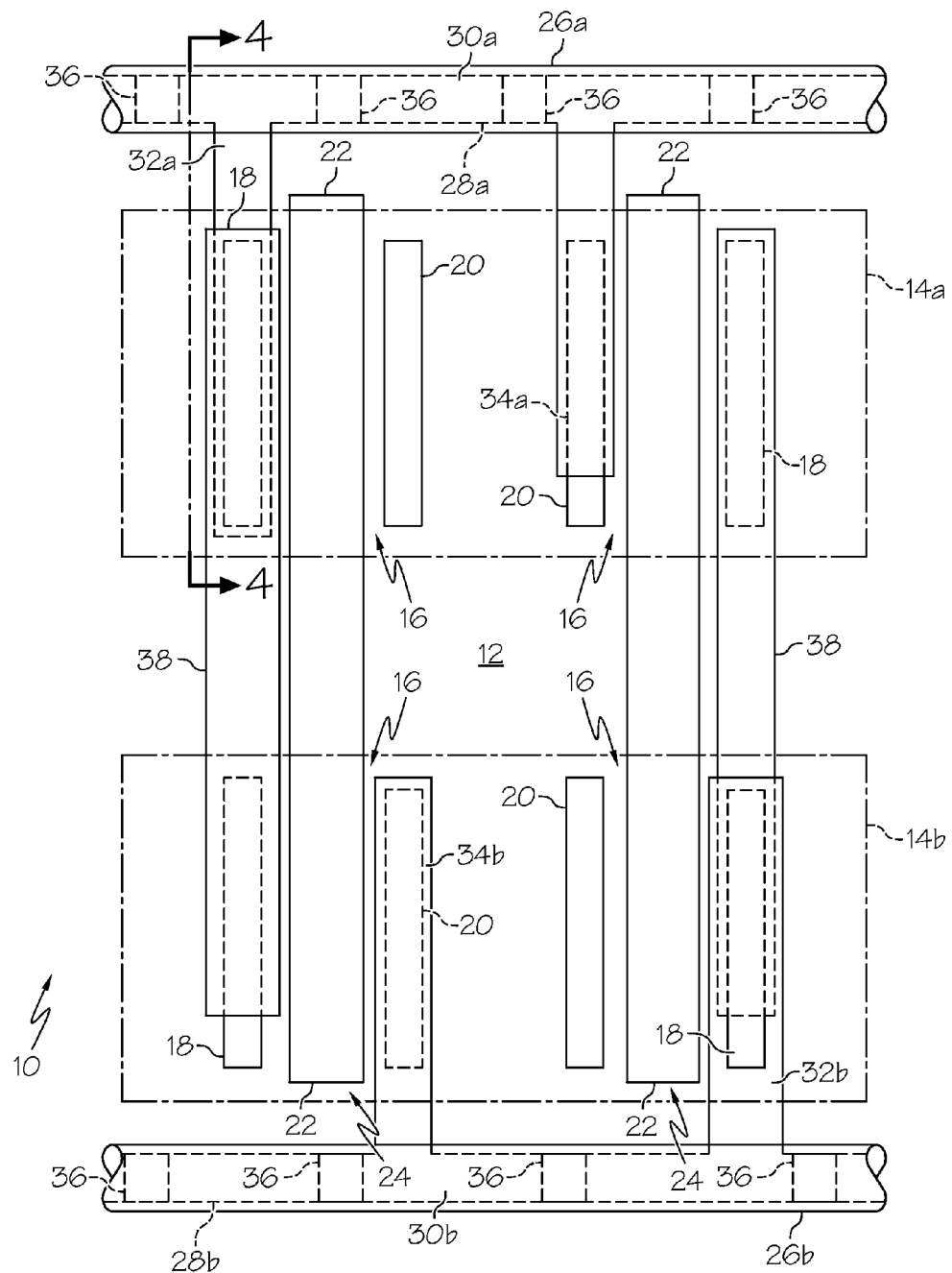
FIG. 3 is a top view of a semiconductor device according to the present invention.

Referring to FIG. 3, the semiconductor device 10 includes a semiconductor substrate 12. The semiconductor substrate 12 includes at least one diffusion region 14 and at least one transistor 16 formed in the at least one diffusion region 14. In the illustrated embodiment, a first diffusion region 14a and a second diffusion region 14b are shown with a plurality of transistors 16 formed in each region 14a, 14b. However, those skilled in the art realize that additional diffusion regions 14a, 14b may be implemented.

In the illustrated embodiment, the transistors 16 are field-effect transistors (FETs) and more specifically, metal-oxide-semiconductor field-effect transistors (MOSFETs). Each of the transistors 16 includes a source 18, a drain 20, and a gate 22. The sources 18, drains 20, and gates 22 are formed in and/or on the substrate 12 using techniques that are well known to those skilled in the art. In the illustrated embodiments, the gates 22 are formed primarily of polycrystalline silicon, commonly referred to as polysilicon or simply PolySi, disposed above the substrate 12.

As can be seen with reference to FIG. 3, the gates 22 are formed as strips 24 generally parallel to one another. The strips 24 are generally linear in shape as is appreciated by those skilled in the art. Gaps (not shown) may be formed in the strips 24 such that more than one transistor 16 may be disposed along each strip 24. Such gaps may be formed using cut mask techniques as readily appreciated by those skilled in the art.

Figure 4:
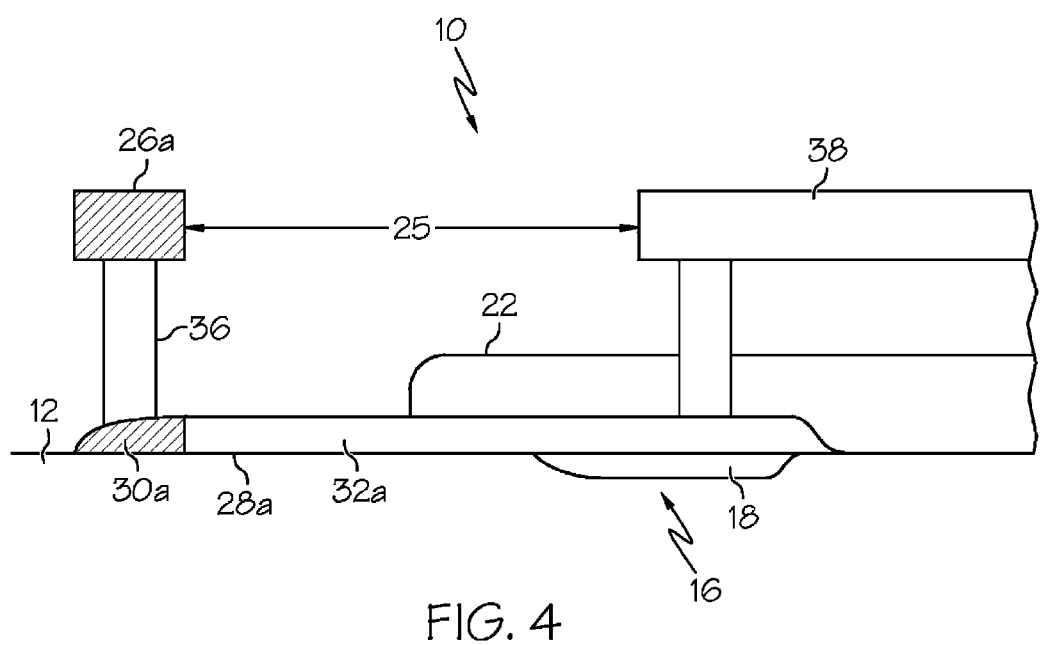
FIG. 4 is a side view of a portion of the semiconductor device according to the present invention as viewed along a line 4-4 shown in FIG. 3.

As best realized with reference to FIG. 4, the semiconductor device 10 includes at least one metal layer 25 disposed above the substrate 12. The at least one metal layer 25 is also disposed above the sources 18, drains 20, and gates 22, of the transistors 16. The at least one metal layer 25 is formed of copper or some other electrically conductive metal as realized by those skilled in the art. Metal layers 25 are routinely labeled and referred to as Metal1, Metal2, etc. or M1, M2, etc., as is appreciated by those skilled in the art.

The metal layer 25 of the illustrated embodiment includes at least one power rail 26. The power rail 26 typically provides a reference voltage or ground as is appreciated by those skilled in the art. Referring again to FIG. 3, the at least one power rail 26 is disposed outside the at least one diffusion region 14. That is, the at least one power rail 26 does not overlap the at least one diffusion region 14. Said another way, the at least one power rail 26 does not extend into, over, or under the at least one diffusion region 14. In the illustrated embodiment, a first power rail 26a is disposed outside and adjacent to the first diffusion region 14a. Similarly, a second power rail 26b is disposed outside and adjacent to the second diffusion region 14b.

Also in the illustrated embodiment, at least a section (not numbered) of each power rail 26a, 26b is generally linear in shape. That is, at least a section of each power rail 26a, 26b extends longitudinally, i.e., along a length. Particularly, the section of each power rail 26a, 26b is generally linear adjacent to the respective diffusion region 14a, 14b. Of course, the at least one power rail 26 may include additional curves, bends, or other non-linear sections.

The semiconductor device 10 further includes at least one contact layer 28 for providing electrical connections between the at least one power rail 26 and the at least one transistor 16. The at least one contact layer 28 is formed of a semiconductor material, e.g., silicon. However, the at least one contact layer 28 may be formed of other semiconductor materials or other suitable materials to provide electrical conductivity as realized by those skilled in the art. The at least one contact layer 28 is disposed above the substrate 12 and below the at least one power rail 26. Said another way, the at least one contact layer 28 is sandwiched between the substrate 12 and the at least one power rail 26. More specifically, in the illustrated embodiments, at least a portion of the at least one contact layer 28 is disposed directly on the substrate 12, as is shown in FIG. 4. Referring again to FIG. 3, the semiconductor device 10 of the illustrated embodiment includes a first contact layer 28a and a second contact layer 28b.

The at least one contact layer 28 includes at least a first length 30 and a second length 32. The first length 30 of the at least one contact layer 28 is disposed outside the at least one diffusion region 14. That is, the first length 30 of the at least one contact layer 28 does not overlap the at least one diffusion region 14. In the illustrated embodiment, each contact layer 28a, 28b includes a first length 30a, 30b that runs generally congruent with the respective power rail 26a, 26b. That is, the first length 30a, 30b of each contact layer 28a, 28b is disposed directly below the respective power rail 26a, 26b. As such, the first length 30a, 30b of each contact layer 28a, 28b is also generally linear in shape. Furthermore, in the illustrated embodiment, the first length 30a, 30b of each contact layer 28a, 28b is generally perpendicular to the gates 22 of the transistors 16.

At least one via 36 is disposed between the at least one contact layer 28 and the at least one power rail 26. The at least one via 36 electrically connects the at least one contact layer 28 to the at least one power rail 26. In the illustrated embodiment, a plurality of vias 36 are disposed between each power rail 26a, 26b and the first length 30a, 30b of each contact layer 28a, 28b. The vias 36 of the illustrated embodiment are spaced from one another to provide balanced electrical conductivity between the contact layers 28a, 28b and the power rails 26a, 26b.

The at least one contact layer 28 includes at least one additional length 32, 34 extending from the first length 30 into the at least one diffusion region 14. Each additional length 32, 34 is electrically connected to at least one of the transistors 16. In the illustrated embodiment, each additional length 32, 34 is electrically connected to a source 18 or a drain 20 of a transistor. However, at least one of the additional lengths 32, 34 may be electrically connected to the gate 22 of one of the transistors 16.

Each contact layer 28a, 28b of the illustrated embodiment includes a second length, 32a, 32b and a third length 34a, 34b. In the illustrated embodiment, the second and third lengths 32a, 32b, 34a, 34b of the contact layers 28a, 28b are also generally linear in shape. Furthermore, the second and third lengths 32a, 32b, 34a, 34b are each generally perpendicular to the respective first lengths 30a, 30b of the contact layers 28a, 28b. As such, the second and third lengths 32a, 32b, 34a, 34b are each generally parallel to the gates 22 of the transistors 16.

Figure 5:
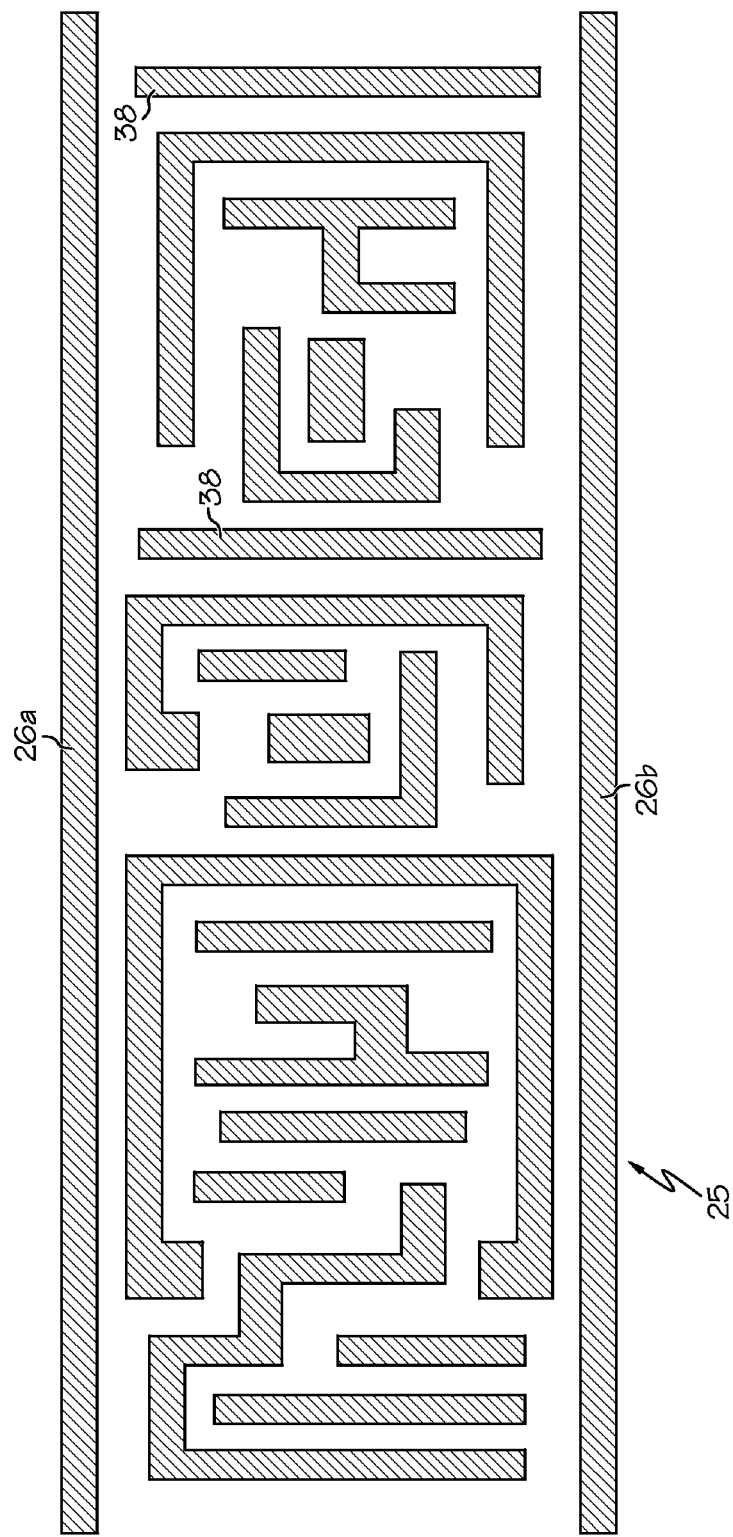
FIG. 5 is a top view of a metal layer of a semiconductor device according to the present invention.

By connecting the at least one transistor 16 to the at least one power rail 26 via the at least one contact layer 28, there is no need for projections from the at least one power rail 26 into the at least one diffusion region 14. As such, the metal layer 25 can be more simply and succinctly utilized for interconnections between the transistors 16, as is shown in FIG. 5.

Referring again to FIGS. 3 and 4, the metal layer 25 of the semiconductor device 10 may also include a pin layer 38 positioned above the at least one transistor 16. As realized by those skilled in the art, the pin layer 38 is a standard feature of Complementary metal-oxide-semiconductor ("CMOS") circuits. Specifically, the pin layer 38 is typically used to connected the source or drain of a p-channel transistor to a source or drain of an n-channel transistor. As such, in the illustrated embodiment, the pin layer 38 extends from the diffusion region 14 to outside of the diffusion region 14. More specifically, the pin layer 38 of the illustrated embodiment extends between the first diffusion region 14a and the second diffusion region 14b.

By connecting the at least one transistor 16 to the at least one power rail 26 via the at least one contact layer 28, the pin layer 38 can be sized larger, i.e., have a greater length, width, and/or surface area, when compared to prior art devices, as there is no projection of the metal layer 25 from the power rail 26 into the diffusion region 14. This will improve conductivity between the pin layer 38 and other components (not shown).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:
1. A semiconductor device comprising:
a semiconductor substrate having a diffusion region;
a transistor formed within said diffusion region and comprising a source, a drain, and a gate;
a metal layer including
a power rail disposed outside said diffusion region and
a pin layer extending from said diffusion region to outside said diffusion region;
a contact layer disposed above said substrate and below said metal layer; and a via disposed between said contact layer and said power rail to electrically connect said contact layer to said power rail; and wherein said contact layer includes a first length disposed outside said diffusion region and a second length extending from said first length into said diffusion region and electrically connected to said transistor.

2. A semiconductor device as set forth in claim 1 wherein said second length of said contact layer is electrically connected to at least one of a source and a drain of said transistor.

3. A semiconductor device as set forth in claim 1 wherein said via is further defined as a plurality of vias disposed between said power rail and said first length of said contact layer and spaced from one another.

4. A semiconductor device as set forth in claim 1 wherein said transistor is further defined as a plurality of transistors formed within said diffusion region.

5. A semiconductor device as set forth in claim 4 wherein said second length of said contact layer is electrically connected to one of said transistors and wherein said contact layer further includes a third length extending from said first length into said diffusion region and electrically connected to another of said transistors.

6. A semiconductor device as set forth in claim 5 wherein said second length and said third length are generally perpendicular to said first length.

7. A semiconductor device as set forth in claim 1 wherein said second length is generally perpendicular to said first length.

8. A semiconductor device as set forth in claim 1 wherein said gate of said transistor extends linearly and said power rail extends linearly and said gate of said transistor and said power rail are generally perpendicular to one another.

9. A semiconductor device as set forth in claim 1 wherein said contact layer comprises a semiconductor material.

10. A semiconductor device comprising:
   a semiconductor substrate having a first diffusion region and a second diffusion region;
   at least one transistor formed within each of said diffusion regions wherein each transistor comprises a source, a drain, and a gate;
   a first power rail disposed outside and adjacent to said first diffusion region;
   a second power rail disposed outside and adjacent to said second diffusion region;
   a first contact layer disposed above said substrate and below said first power rail;
   a second contact layer disposed above said substrate and below said second power rail; and
   a plurality of vias disposed between said contact layers and said power rails to respectively electrically connect said contact layers to said power rails; wherein
   said first contact layer including a first length running generally congruent with said first power rail and a second length extending from said first length into said first diffusion region and electrically connected to said at least one transistor; and wherein
   said second contact layer including a first length disposed outside said diffusion region and a second length extending from said first length into said second diffusion region and electrically connected to said at least one transistor.

11. A semiconductor device as set forth in claim 10 wherein said second length of said contact layer is electrically connected to at least one of a source and a drain of said at least one transistor.

12. A semiconductor device as set forth in claim 10 wherein said at least one transistor is further defined as a plurality of transistors formed within each of said diffusion regions.

13. A semiconductor device as set forth in claim 12 wherein said second length of said first contact layer is electrically connected to one of said transistors and wherein said first contact layer further includes a third length extending from said first length into said diffusion region and electrically connected to another of said transistors.

14. A semiconductor device as set forth in claim 13 wherein said second length and said third length of said first contact layer are generally perpendicular to said first length of said first contact layer.

15. A semiconductor device as set forth in claim 10 wherein said second length of said first contact layer is generally perpendicular to said first length of said first contact layer.

16. A semiconductor device as set forth in claim 10 wherein said gates of said transistors extend linearly and said power rails extend linearly and said gates of said transistors are generally perpendicular to power rails.

17. A semiconductor device as set forth in claim 9 further comprising a metal pin layer extending from said first diffusion region to said second diffusion region.

18. A semiconductor device as set forth in claim 9 wherein said second length of said contact layer is electrically connected to at least one of a source and a drain of said at least one transistor.

19. A semiconductor device as set forth in claim 10 further comprising
   a metal pin layer extending from said first diffusion region to said second diffusion region; and wherein
   said contact layers each comprise a semiconductor material;
   said at least one transistor is further defined as a plurality of transistors formed within each of said diffusion regions;
   said second length of said first contact layer is electrically connected to one of said transistors and wherein said first contact layer further includes a third length extending from said first length into said diffusion region and electrically connected to another of said transistors;
   said second length and said third length of said first contact layer are generally perpendicular to said first length of said first contact layer;
   said second length of said first contact layer is generally perpendicular to said first length of said first contact layer; and
   said gates of said transistors extend linearly and said power rails extend linearly and said gates of said transistors are generally perpendicular to power rails.

* * * * *